(12) United States Patent
Furubayashi et al.

(10) Patent No.: US 8,764,023 B2
(45) Date of Patent: Jul. 1, 2014

(54) GASKET

(75) Inventors: Jun Furubayashi, Aso (JP); Yohei Miki, Aso (JP)

(73) Assignee: NOK Corporation (JP)

( * ) Notice: Subject to any disclaimer, the term of this patent is extended or adjusted under 35 U.S.C. 154(b) by 89 days.

(21) Appl. No.: 13/824,775

(22) PCT Filed: Jun. 30, 2011

(86) PCT No.: PCT/JP2011/065066
§ 371 (c)(1),
(2), (4) Date: Apr. 19, 2013

(87) PCT Pub. No.: WO2012/056768
PCT Pub. Date: May 3, 2012

(65) Prior Publication Data
US 2013/0207352 A1 Aug. 15, 2013

(30) Foreign Application Priority Data
Oct. 26, 2010 (JP) ................................. 2010-239316

(51) Int. Cl.
*F16J 15/02* (2006.01)

(52) U.S. Cl.
USPC .......................................... 277/637; 277/644

(58) Field of Classification Search
USPC .......................................... 277/637, 641, 644
See application file for complete search history.

(56) References Cited

U.S. PATENT DOCUMENTS

| | | | | |
|---|---|---|---|---|
| 4,640,455 A * | 2/1987 | Grein et al. | .................... | 228/176 |
| 5,002,290 A * | 3/1991 | Pernin | .......................... | 277/649 |
| 5,536,018 A * | 7/1996 | Szott | ............................. | 277/313 |
| 6,129,358 A * | 10/2000 | Kiesel et al. | ................... | 277/436 |
| 6,328,316 B1 * | 12/2001 | Fukuhara et al. | ............. | 277/644 |
| 6,523,833 B1 * | 2/2003 | Ishigaki et al. | ................ | 277/650 |
| 6,722,660 B2 * | 4/2004 | Gernand et al. | ............... | 277/591 |
| 7,004,479 B2 * | 2/2006 | Oida et al. | ..................... | 277/644 |
| 7,029,013 B2 * | 4/2006 | Yajima et al. | .................. | 277/637 |
| 7,309,068 B2 * | 12/2007 | Segawa et al. | ................. | 277/596 |
| 7,959,161 B2 * | 6/2011 | Seki et al. | ...................... | 277/648 |
| 2004/0012157 A1 | 1/2004 | Oida et al. | | |
| 2005/0242530 A1 | 11/2005 | Oida et al. | | |

FOREIGN PATENT DOCUMENTS

| | | |
|---|---|---|
| JP | 62-108661 U | 7/1987 |
| JP | 6-32834 | 4/1994 |
| JP | 2004-039341 A | 2/2004 |
| JP | 2004-340315 A | 12/2004 |
| JP | 2008-249139 A | 10/2008 |

* cited by examiner

*Primary Examiner* — Gilbert Lee
(74) *Attorney, Agent, or Firm* — Harness, Dickey & Pierce, P.L.C.

(57) ABSTRACT

The invention provides a gasket which can be easily formed, can be highly compressed with a low reaction force, and is highly reliable. A gasket consisting of a rubber-like elastic material is mounted in a mounting groove formed in one of two mutually opposing members and is pinched between one member and another member so as to be in pressure-contact with both the members. The gasket has a body section inserted into the mounting groove, one support protrusion provided on the side of the body section which faces the bottom of the mounting groove, located on one end side of the body section in the width direction thereof, and in contact with the bottom, and a lip protrusion provided on the side of the body section which faces another member and having a tip located at substantially the center of the body section in the width direction thereof.

8 Claims, 7 Drawing Sheets

US 8,764,023 B2

GASKET

CROSS-REFERENCE TO RELATED APPLICATIONS

This application is a U.S. National Stage Application of International Application No. PCT/JP2011/065066 filed on Jun. 30, 2011, and published in Japanese as WO 2012/056768 A1 on May 3, 2012. This application claims priority to Japanese Application No. 2010-239316 filed on Oct. 26, 2010. The disclosures of the above applications are incorporated herein by reference.

BACKGROUND OF THE INVENTION

1. Field of the Invention

The present invention relates to a gasket.

More particularly, the present invention relates to a gasket for a case which is made of a material having a low rigidity such as a synthetic resin, an aluminum or the like, and is used in an electronic equipment or the like.

2. Description of the Conventional Art

Conventionally, in a case cover of an electronic equipment or the like which is formed by a material having a low rigidity such as a synthetic resin or the like, in the light of a reservation of a sealing performance with respect to a suppression of deformation of the cover and a dispersion of a dimensional precision at a time of fastening (a tracking with respect to a partial dispersion of an amount of compression), it is often the case that a gasket having a low reaction force property and having a small rate of change of a reaction force with respect to an amount of compression is employed.

As this kind of gasket, as shown in FIG. 11, there has been known a structure constructed by a body section 310 which is inserted to a mounting groove (not illustrated), two rows of support protrusions 320 and 330 which are provided in a bottom portion side of the body section 310 and extend in parallel to the body section 310, and a lip protrusion 340 which is provided in another side of the body section 310.

Further, an air gap 350 is provided in a bottom portion side of the mounting groove in an opposite surface to the lip protrusion 340, thereby forming a shape which buffers a compression of a rubber-like elastic member (Japanese Unexamined Utility Model Publication No. 62-108661).

However, even in the gasket 300 having the shape mentioned above, it has not been a gasket having an acceptable low reaction force, with respect to the case which is made of the material having the low rigidity such as the synthetic resin, the aluminum or the like, and is used in the electronic equipment or the like.

Consequently, a gasket 300 having a shape shown in FIG. 12 has been proposed (Japanese Unexamined Patent Publication No. 2004-39341).

In other words, the gasket 300 is constructed by a body section 310 which is inserted to a mounting groove 110 of a case (one member) 100, and a lip protrusion 340 which is provided in another side of the body section 310, and the lip protrusion 340 is formed as a shape which extends while being inclined with respect to the body section 310.

In accordance with the above-mentioned construction, as shown in FIG. 13, it is possible to expect to achieve a low reaction force of the lip protrusion 340 and improve a tracking performance at a time of being brought into pressure contact with and pinched with respect to another member 200.

However, in the lip protrusion 340 having the inclined structure mentioned above, since the lip protrusion 340 is forcedly unmolded at a time of forming and unmolding the gasket 300, there is brought about a problem that the lip protrusion 340 tends to be broken and a workability is deteriorated, in the shape in which the incline is enlarged.

On the other hand, if an angle of incline of the lip protrusion 340 is made smaller, it is hard to come to a low reaction force even if the lip protrusion 340 falls over, and a change of the reaction force with respect to the amount of compression becomes larger. Further, since it is hard to fall over in a fixed direction in accordance with an aiming, and there is a possibility that it falls over partly in a reverse direction, a reduction of a sealing performance is brought about.

SUMMARY OF THE INVENTION

Problem to be Solved by the Invention

An object of the present invention is to provide a gasket which can be easily formed, can achieve a high compression and a low reaction force, and has a high reliability.

Means for Solving the Problem

In order to achieve the object mentioned above, in accordance with the present invention, there is provided a gasket which is mounted to a mounting groove provided in one member of two members which are opposed to each other so as to be brought into pressure contact with and pinched with respect to another member, and is made of a rubber-like elastic material, the gasket being constructed by a body section which is inserted to the mounting groove, one support protrusion which comes into contact with a bottom portion provided in one end side in a width direction of the body section in the bottom portion side of the mounting groove of the body section, and a lip protrusion which is provided in a side facing to the another member of the body section and is positioned its leading end portion in an approximately center portion in the width direction of the body section, wherein a gap exists between the another end side in the width direction of the body section and the bottom portion in a stage before the gasket is embedded, and the body section displaces in such a manner as to be inclined to the gap side around the one support protrusion as a supporting point in a stage in which the gasket is embedded.

Effect of the Invention

The present invention achieves the following effects.

In accordance with the gasket of the invention described in the first aspect, it is possible to obtain the gasket which can be easily formed, can be highly compressed while having the low reaction force, and has a high reliability.

Further, in accordance with the gasket of the invention described in the second aspect, a high compression and a low reaction force can be achieved, and an attitude stability of the gasket after being embedded is good.

Further, in accordance with the gasket of the invention described in the third aspect, it is possible to obtain the gasket which can be highly compressed and a lower reaction force.

Further, in accordance with the gasket of the invention described in the fourth aspect, since the lip protrusion always comes down in the fixed direction in accordance with the aiming, it is possible to more enhance the reliability of the sealing performance.

Further, in accordance with the gasket of the invention described in the fifth aspect, it is possible to reduce a resistance of an insertion of the gasket into the mounting groove, and it is possible to achieve the gasket which can be highly compressed with a lower reaction force.

Further, in accordance with the gasket of the invention described in the sixth aspect, it is easy to unmold from a metal die at a time of forming, and it is possible to achieve the gasket which can be highly compressed with a lower reaction force.

Further, in accordance with the gasket of the invention described in the seventh aspect, it is easy to insert the gasket into the mounting groove, and it is possible to prevent the gasket from collapsing to an inner peripheral side of the mounting groove.

Further, in accordance with the gasket of the invention described in the eighth aspect, it is easy to insert the gasket into the mounting groove, and it is possible to more securely prevent the gasket from collapsing to the inner peripheral side of the mounting groove.

DETAILED DESCRIPTION OF PREFERRED EMBODIMENT

A description will be given below of a best mode for carrying out the present invention.

Figure 1:
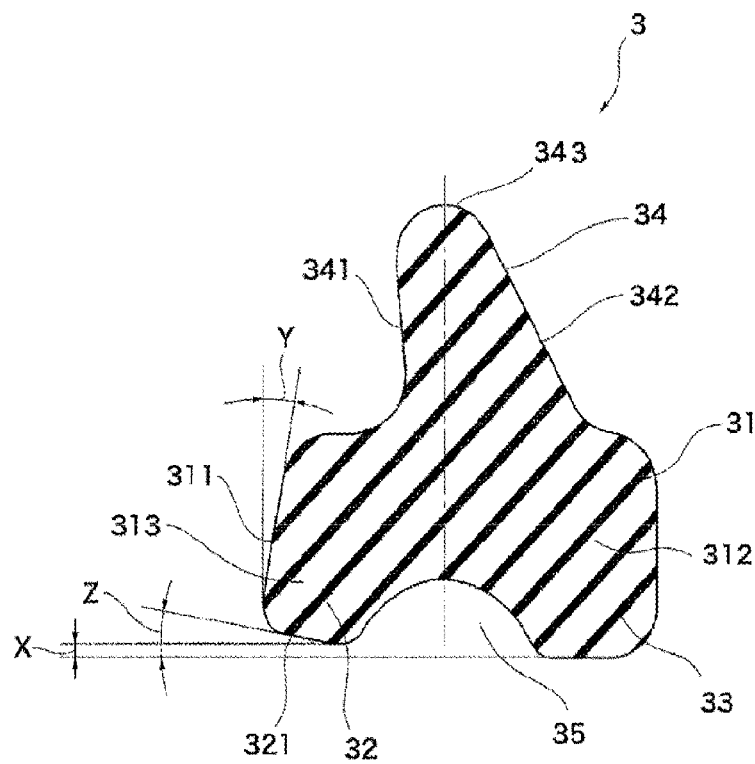
FIG. 1 is a cross sectional view of a gasket in accordance with a first embodiment of the present invention.
Figure 2:
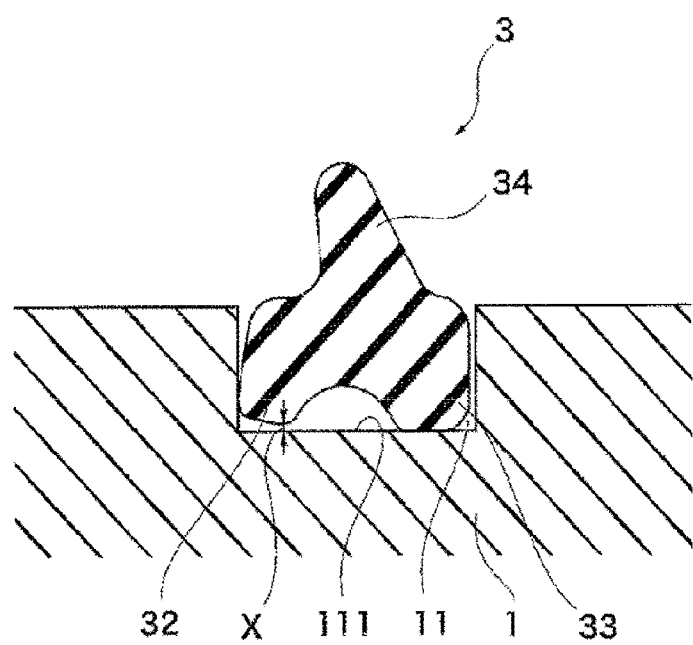
FIG. 2 is a view of a state in which the gasket in FIG. 1 is inserted to a mounting groove.
Figure 3:
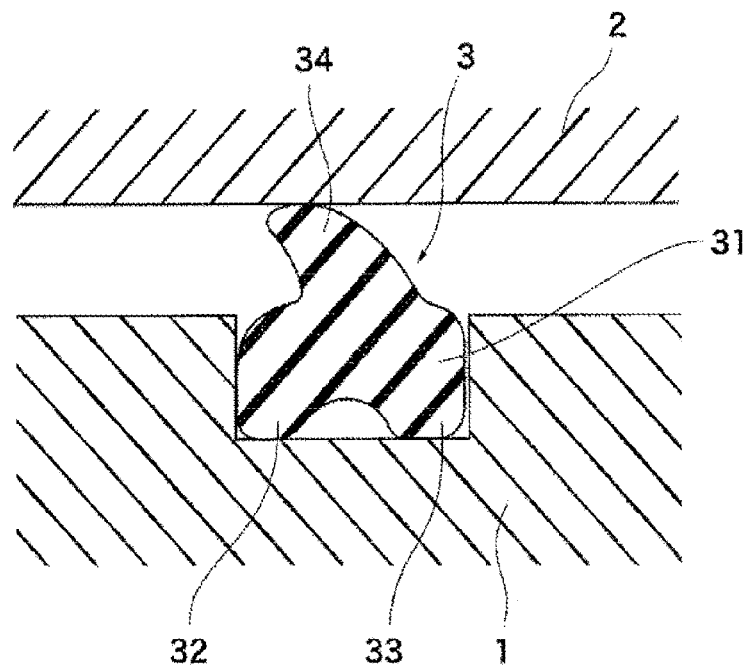
FIG. 3 is a view of a state in which another member is assembled and the gasket is pinched in a pressure contact manner.

A gasket of a first embodiment in accordance with the present invention is a gasket 3 which is mounted to a mounting groove 11 provided in one member 1 of two members 1 and 2 which are opposed to each other so as to be brought into pressure contact with and pinched with respect to another member 2, and is made of a rubber-like elastic material, as shown in FIG. 1, FIG. 2 and FIG. 3.

Further, the gasket 3 is provided with a body section 31 which is inserted to the mounting groove 11, one support protrusion 33 which is arranged in a bottom portion 111 side of the mounting groove 11 of the body section 31, and comes into contact with the bottom portion 111 formed in one end side 312 (a right side on the drawing) in a width direction of the body section 31, and another support protrusion 32 which has a gap X with respect to the bottom portion 111 in a stage before the gasket 3 is embedded, in another end side 313 (a left side on the drawing) in the width direction of the body section 31.

Further, there is formed a lip protrusion 34 in which a leading end portion 343 thereof is positioned between the one support protrusion 33 and the another support protrusion 32 in an approximately center portion in the width direction of the body section 31.

Further, since the another support protrusion 32 is designed to be shorter in comparison with the one support protrusion 33, the another support protrusion 32 keeps a state having the gap X from the bottom portion 111, in a stage of being mounted to the mounting groove 11, as shown in FIG. 2.

Next, as shown in FIG. 3, the body section 31 displaces in such a manner as to be inclined to the gap X side around the one support protrusion 33 as a supporting point in a stage that the gasket 3 is pinched in a pressure contact manner, by the another member 2.

As mentioned above, if the lip protrusion 34 is pressed by the another member 2, a counterclockwise moment is applied around the one support protrusion 33 as a supporting point. Accordingly, since the lip protrusion 34 always comes down in a fixed direction in accordance with an aiming, and it is possible to securely make the lip protrusion 34 incline, it is possible to achieve a gasket which has a high reliability of a sealing performance and a low reaction force.

In this case, the present embodiment is structured such that the body section 31 displaces in such a manner as to be inclined to the gap X side around the one support protrusion 33 as a supporting point, in the stage that the gasket 3 is pinched in the pressure contact manner by the another member 2, however, may be structured such that the body section 31 displaces in such a manner as to be inclined to the gap X side around the another support protrusion 33 as a supporting point, in the stage that the gasket 3 is mounted to the mounting groove 11.

In the gasket in accordance with this first embodiment, as shown in FIG. 3, the another support protrusion 32 is designed such as to come into contact with the bottom portion 111 of the mounting groove 11 in the stage that the gasket 3 is pinched in the pressure contact manner by the another member 2.

In accordance with this design, the attitude of the gasket 3 becomes stable, and it is possible to achieve the gasket having a high reliability.

Further, the leading end portion 343 of the lip protrusion 34 is designed such as to exist at a position which approximately comes into line with a center portion of an air gap 35 existing between the support protrusions 32 and 33.

In accordance with this design, since a deformation of the lip protrusion 34 can be easily achieved on the basis of the existence of the air gap 35, it is possible to achieve the gasket which has a lower reaction force and can be more highly compressed.

Further, as shown in FIG. 1, in the inclines of both slant surfaces 341 and 342 which form the lip protrusion 34, the slant surface 341 in the side of the another support protrusion 32 provided with the gap X is made steeper in comparison the another slant surface 342.

More particularly, the slant surface 341 in the side of the another support protrusion 32 comes to a slant surface which is approximately in parallel to the center of the axis of the gasket 3, or is somewhat convergent toward the air gap 35 side.

In accordance with this design, since the lip protrusion 34 can always come down in a fixed direction (to a left side on the drawing) in accordance with an aiming and it is possible to incline the lip protrusion 34 more, it is possible to obtain a gasket which has a low reaction force and has a high reliability of the sealing performance.

Further, the body section 31 and a side surface 311 of the another support protrusion 32 come to a slant surface provided with an angle of incline Y which is convergent toward the lip protrusion 34.

In accordance with this design, it is possible to reduce an insertion resistance of the gasket into the mounting groove, and it is possible to obtain a gasket which has a lower reaction force and can be more highly compressed.

Further, as shown in FIG. 3, since the side surface 311 of the another support protrusion 32 thoroughly comes into contact with the side surface of the mounting groove 11 in the stage that the gasket 3 is pinched in the pressure contact manner by the another member 2, the gasket 3 can maintain a stable attitude within the mounting groove 11.

Further, a bottom surface 321 facing to the bottom surface 111 of the another support protrusion 32 comes to a slant surface which is provided with an angle of incline Z and diverges toward the side surface 311.

In accordance with this design, it is possible to obtain a gasket which can be easily unmolded from the metal die at a time of forming, has a lower reaction force and can be more highly compressed.

Further, as shown in FIG. 3, since the bottom surface 321 of the another support protrusion 32 thoroughly comes into contact with the bottom surface 111 of the mounting groove 11 in the stage that the gasket 3 is pinched in the pressure contact manner by the another member 2, the gasket 3 can maintain a stable attitude within the mounting groove 11.

A material used in the gasket 1 is a rubber material which is provided with a rubber-like elasticity.

As the rubber material, there can be listed up a nitrile rubber, an acrylic rubber, an EPDM, a CR, a silicone rubber, a fluorine rubber, a natural rubber and the like, and they can be appropriately selected and used in correspondence to an intended use.

A rubber hardness is preferably between Hs40 and Hs60, and it is important to make it equal to or lower than Hs70 for obtaining a low reaction force.

Figure 4:
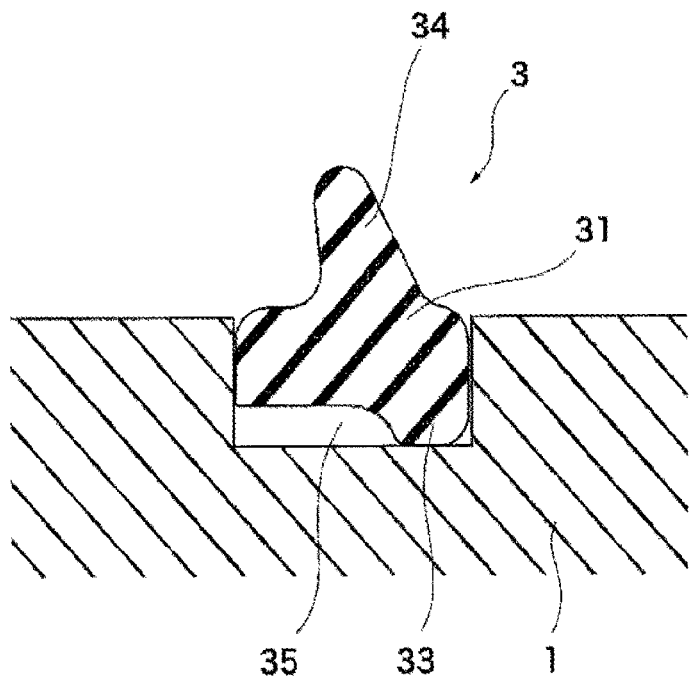
FIG. 4 is a view showing a second embodiment in accordance with the present invention in the same manner as FIG. 2.

Next, a description will be given of a second embodiment in accordance with the present invention with reference to FIG. 4.

A different point from the first embodiment is a point of making short to such a degree that the another support protrusion 32 hardly exists.

In accordance with this design, the stability of the attitude of the gasket 1 is somewhat deteriorated, however, there are such advantages that it is possible to make the lip protrusion 34 more incline, and it is possible to easily unmold from the metal die at a time of forming.

Figure 5:
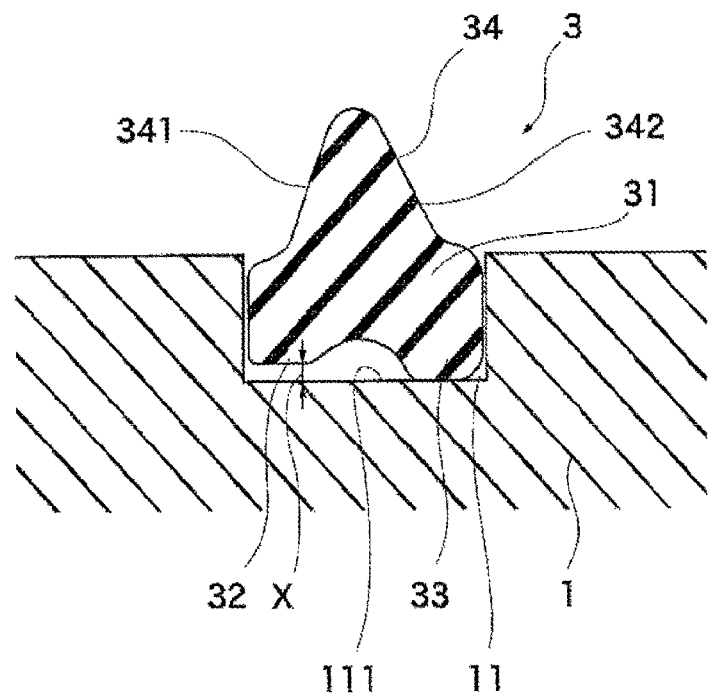
FIG. 5 is a view showing a third embodiment in accordance with the present invention in the same manner as FIG. 2.

Next, a description will be given of a third embodiment in accordance with the present invention with reference to FIG. 5.

A different point from the first embodiment is a point that a length of the another support protrusion 32 is made shorter than the first embodiment and is made longer than the second embodiment, and a point that the inclines of both the slant surfaces 341 and 342 of the lip protrusion 34 are made identical.

Even in the lip protrusion 34 having the shape mentioned above, since the gap X exists with respect to the bottom portion 111 of the mounting groove 11 in the side of the another support protrusion 32, the lip protrusion 34 is inclined to a left side on the drawing in the stage that the gasket 3 is pinched in the pressure contact manner by the another member 2, and it is possible to obtain a gasket which has a lower reaction force and can be more highly compressed.

Figure 6:
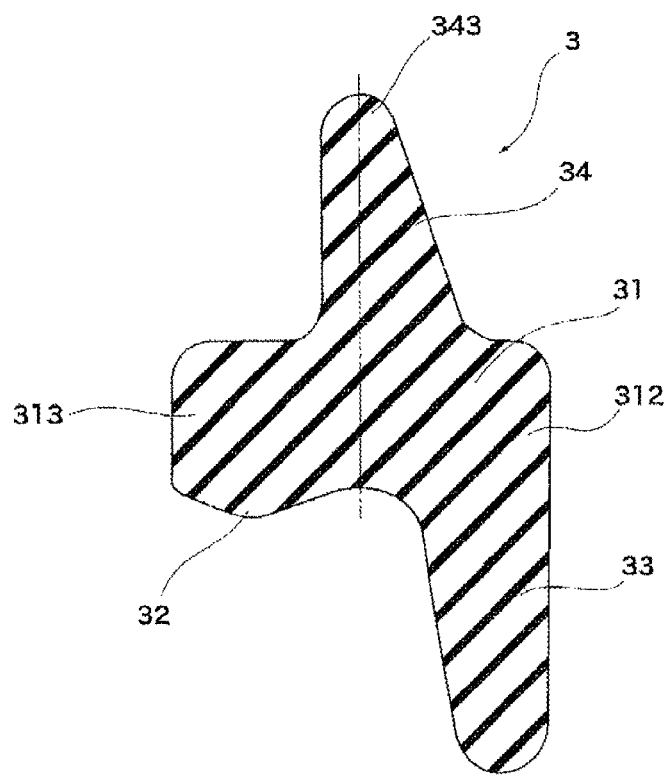
FIG. 6 is a cross sectional view of a gasket in accordance with a fourth embodiment of the present invention.

Next, a description will be given of a fourth embodiment in accordance with the present invention with reference to FIG. 6 to FIG. 8.

A big different point from the previous embodiments is a point that an elongated one support protrusion 33 is inserted into a deep groove portion 112 which is provided in a part of the bottom portion 111 of the mounting groove 11.

Figure 7:
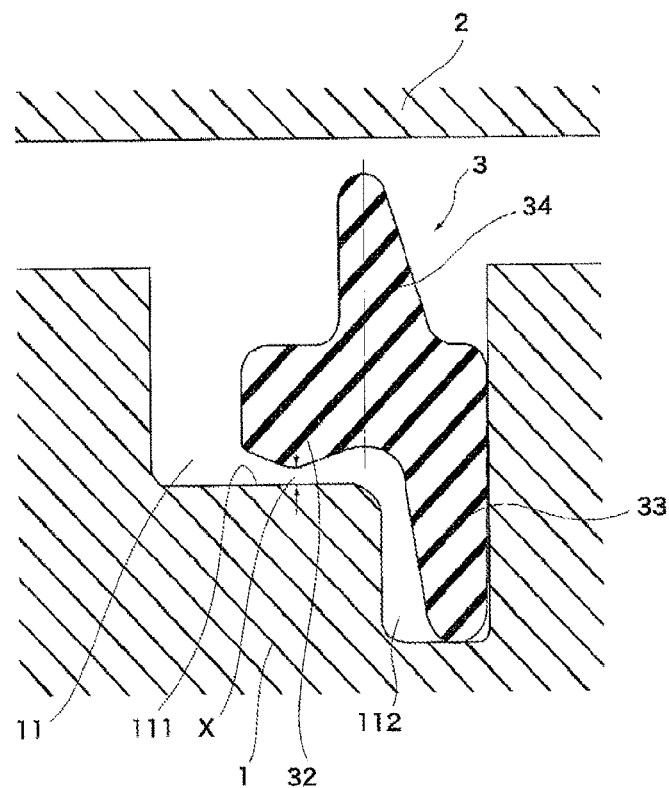
FIG. 7 is a view of a state in which the gasket in FIG. 6 is inserted to a mounting groove.

Further, the another support protrusion 32 is formed such a shape as to slightly protrude toward the bottom portion 111 of the mounting groove 11 from the body section 31, and a gap X exists between the support protrusion 32 and the bottom portion 111 in the stage that the gasket 3 is inserted into the mounting groove 11, as shown in FIG. 7.

Figure 8:
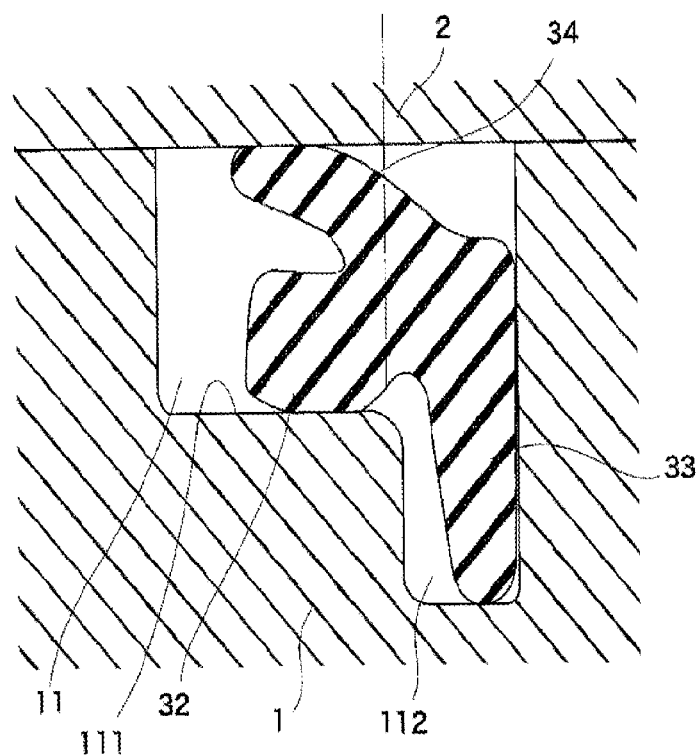
FIG. 8 is a view of a state in which another member is assembled and the gasket is pinched in a pressure contact manner.

Further, as shown in FIG. 8, if the another member 2 is assembled, and the gasket 3 is pinched in the pressure contact manner, the another support protrusion 32 comes into contact with the bottom portion 111, and the gasket 3 is inclined to the another support protrusion 32 side around the one support protrusion 33 as a supporting point, and maintains an elastic contact state with respect to the another member 2.

In accordance with the structure mentioned above, it is easy to insert the gasket 3 into the mounting groove 11, and it is possible to prevent the gasket 3 from coming down to the inner peripheral side of the mounting groove 11.

Figure 9:
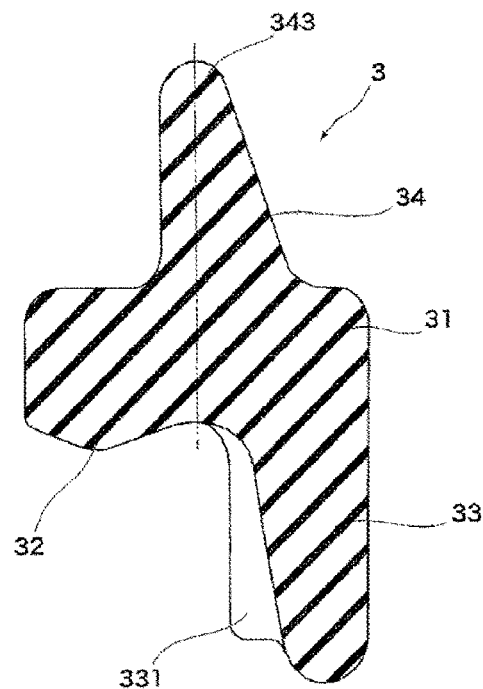
FIG. 9 is a cross sectional view of a gasket in accordance with a fifth embodiment of the present invention.

Next, a description will be given of a fifth embodiment in accordance with the present invention with reference to FIGS. 9 and 10.

A different point from the fourth embodiment is a point that a retaining protrusion 331 is provided in a peripheral surface of the one support protrusion 33.

The retaining protrusion 331 is structured such that a plurality of retaining protrusions are provided at even intervals in the inner peripheral surface side (a left side on the drawing) of the one support protrusion 33.

Figure 10:
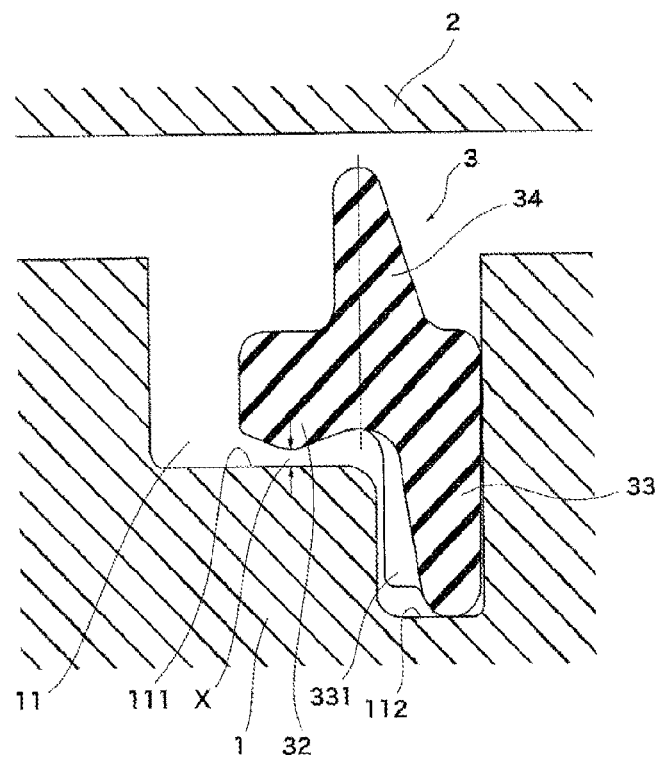
FIG. 10 is a view of a state in which the gasket in FIG. 9 is inserted to a mounting groove.
Figure 11:
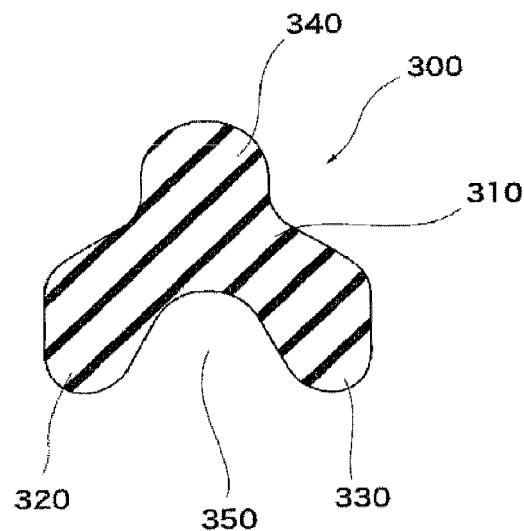
FIG. 11 is a cross sectional view of a gasket in accordance with a prior art.
Figure 12:
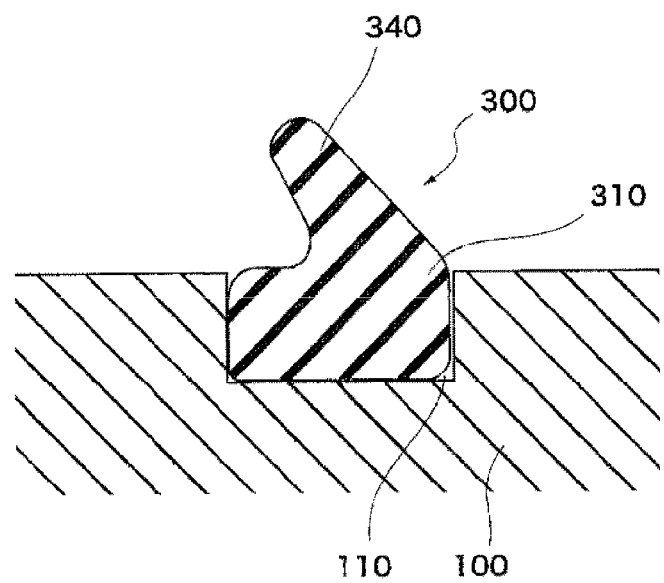
FIG. 12 is a cross sectional view of another gasket in accordance with the prior art.
Figure 13:
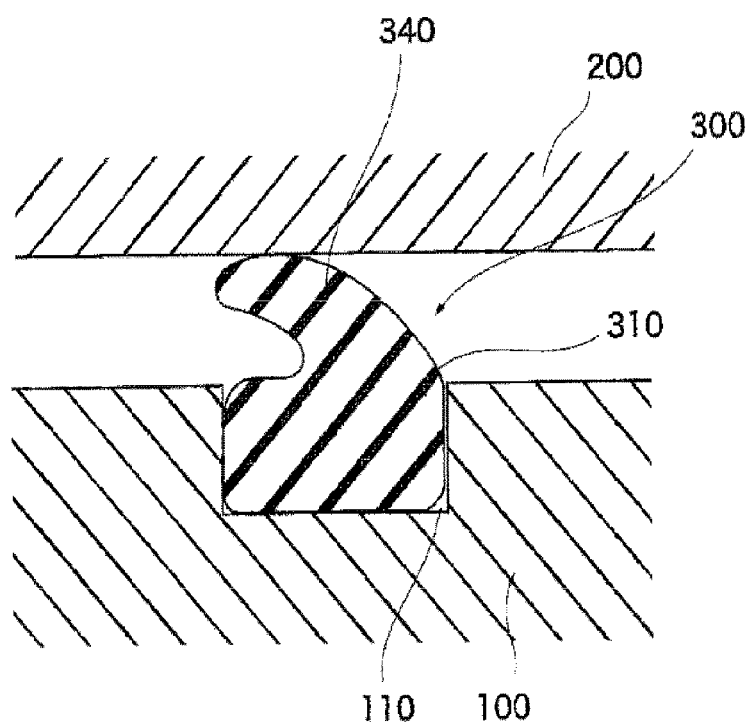
FIG. 13 is a view of a state in which another member is assembled and the gasket is pinched in a pressure contact manner.

Further, as shown in FIG. 10, if the gasket 3 is inserted into the mounting groove 11, the retaining grooves 331 come into contact with the peripheral surface of the deep groove portion 112, and it is possible to prevent the gasket from coming down in the state before the gasket 3 is assembled into the state of being pinched in the pressure contact manner.

As mentioned above, in accordance with this embodiment, it is easy to insert the gasket 3 into the mounting groove 11, and it is possible to more securely prevent the gasket 3 from coming down to the inner peripheral side of the mounting groove 11.

INDUSTRIAL APPLICABILITY

The gasket in accordance with the present invention can be used in the gasket for the case which is made of the material having the low rigidity such as the synthetic resin, the aluminum or the like, and is used in the electronic equipment or the like.

What is claimed is:

1. A gasket which is mounted to a mounting groove provided in one member of two members which are opposed to each other so as to be brought into pressure contact with and pinched with respect to another member, and is made of an elastic material, said gasket being constructed by a body section which is inserted to said mounting groove, one support protrusion which comes into contact with a bottom portion provided in one end side in a width direction of said body section in the bottom portion side of said mounting groove of said body section, and a lip protrusion which is provided in a side facing to said another member of said body section and a leading end portion of said lip protrusion is approximately aligned with a center portion in the width direction of said body section, wherein a gap exists between the another end side in the width direction of said body section and said bottom portion in a stage before said gasket is embedded, and said body section displaces in such a manner as to be inclined to said gap side around said one support protrusion as a supporting point in a stage in which said gasket is embedded.

2. The gasket as claimed in claim 1, wherein another support protrusion which is provided with said gap with respect to said bottom portion in a stage before said gasket is embedded exists in another end side in a width direction of said body section.

3. The gasket as claimed in claim 2, wherein said leading end portion of said lip protrusion exists at a position which approximately comes into line with a center portion of an air gap existing between said both support protrusions.

4. The gasket as claimed in claim 2, wherein in inclines of both slant surfaces forming said lip protrusion, the slant surface in a side of said another support protrusion which is provided with said gap is steeper in comparison with the another slant surface.

5. The gasket as claimed in claim 2, wherein said body section and a side surface of said another support protrusion come to a slant surface which is convergent toward said lip protrusion.

6. The gasket as claimed in claim 2, wherein a bottom surface facing to said bottom portion of said another support protrusion comes to a slant surface which diverges toward a side of said side surface.

7. The gasket as claimed in claim 1, wherein a deep groove portion is provided in a part of the bottom portion of said mounting groove, and a part of said one support protrusion is inserted into said deep groove portion.

8. The gasket as claimed in claim 7, wherein a retaining protrusion is provided in a peripheral surface of said one support protrusion.

\* \* \* \* \*